United States Patent
Kwak et al.

(10) Patent No.: US 7,692,191 B2
(45) Date of Patent: Apr. 6, 2010

(54) TOP-EMITTING ORGANIC LIGHT EMITTING DEVICE

(75) Inventors: Won-Kyu Kwak, Suwon-si (KR); Kwan-Hee Lee, Suwon-si (KR)

(73) Assignee: Samsung Mobile Display Co., Ltd., Yongin, Gyunggi-do (KR)

(*) Notice: Subject to any disclaimer, the term of this patent is extended or adjusted under 35 U.S.C. 154(b) by 0 days.

(21) Appl. No.: 11/327,141

(22) Filed: Jan. 6, 2006

(65) Prior Publication Data

US 2006/0170634 A1 Aug. 3, 2006

(30) Foreign Application Priority Data

Jan. 31, 2005 (KR) .................... 10-2005-0008756

(51) Int. Cl.
*H01L 29/94* (2006.01)
(52) U.S. Cl. ................ 257/59; 257/72; 257/E51.042; 257/E51.043; 257/E51.049; 438/151
(58) Field of Classification Search ............... 257/72, 257/59; 438/151; 349/92; 345/92
See application file for complete search history.

(56) References Cited

U.S. PATENT DOCUMENTS

2003/0062545 A1* 4/2003 Yamazaki et al. ........... 257/200
2003/0132927 A1* 7/2003 Ouchi et al. ................ 345/204
2003/0137255 A1* 7/2003 Park et al. ................ 315/169.3
2003/0214245 A1* 11/2003 Yamazaki et al. ........ 315/169.3
2005/0180083 A1* 8/2005 Takahara et al. ............ 361/152
2005/0285825 A1* 12/2005 Eom et al. .................... 345/76
2006/0044229 A1* 3/2006 Yamazaki et al. ............. 345/76
2006/0097628 A1* 5/2006 Suh et al. .................... 313/504
2006/0189047 A1* 8/2006 Yamazaki et al. ........... 438/149

FOREIGN PATENT DOCUMENTS

| JP | 11-251069 | 9/1999 |
|---|---|---|
| KR | 10-2002-0047889 | 6/2002 |
| KR | 10-2004-0005700 | 1/2004 |
| KR | 10-2004-0086607 | 10/2004 |

OTHER PUBLICATIONS

Korean Patent Registration Gazette issued Mar. 21, 2007.

* cited by examiner

*Primary Examiner*—Ahmed Sefer
(74) *Attorney, Agent, or Firm*—Knobbe Martens Olson & Bear LLP

(57) ABSTRACT

A top-emitting organic light emitting device having an improved pixel electrode layout for decreasing photo-leakage of a thin film transistor and enhancing an aperture ratio is provided. In the top-emitting organic light emitting device, the pixel electrode is designed to have the maximum size allowed by a layout design rule. Further, the pixel electrode is formed to overlap all the thin film transistors below.

27 Claims, 6 Drawing Sheets

TOP-EMITTING ORGANIC LIGHT EMITTING DEVICE

CROSS-REFERENCE TO RELATED APPLICATION

This application claims priority to and the benefit of Korean Patent Application No. 10-2005-0008756, filed Jan. 31, 2005, which is incorporated herein by reference in its entirety.

BACKGROUND OF THE INVENTION

1. Field of the Invention

The present invention relates to an organic light emitting device, and more particularly, to a top-emitting organic light emitting device having an improved pixel electrode layout for decreasing photo-leakage of a thin film transistor and enhancing aperture ratio.

2. Description of the Related Technology

In general, an organic light emitting device employs an organic light emitting diode made of a fluorescent or phosphoric organic compound that can be electrically excited. The organic light emitting diode has a layered structure including an anode, an organic emitting layer and a cathode, and illuminates according to an applied voltage or current. The organic emitting layer has a multi-layered structure including a hole injecting layer and an electron injecting layer, which are formed on either side of an emitting layer to enhance electron and hole injection characteristics. Furthermore, an organic thin film layer can selectively include an electron transporting layer, a hole transporting layer, and a hole blocking layer, to enhance emission characteristics of the organic emitting device.

The organic light emitting device may be a passive matrix type or an active matrix type according to the driving method. For example, a passive matrix device receives a current only when the scan line to which it is connected is selected. The device then uses the current to control the brightness of the pixel.

On the other hand, an active matrix pixel uses a capacitor to store a voltage for controlling the light emission of the pixel. The device applies the stored voltage to the pixel in a period corresponding to a frame. An active matrix display may be a voltage programming type or a current programming type according to the signal applied for storing the voltage in the capacitor.

Further, the organic light emitting device is classified into a bottom-emitting type and a top-emitting type according to a position of a reflecting layer. The bottom-emitting device reflects light emitted from the organic emitting layer in the direction of the bottom of the substrate, and the top-emitting device reflects the light emitted from the organic emitting layer in the direction of the top of the substrate.

FIG. 1 is a layout view of red, green, and blue pixels of a pixel array in a conventional top-emitting organic light emitting device.

Referring to FIG. 1, red (R), green (G) and blue (B) pixels are arranged on a substrate. Connected to each pixel, there are scan lines Sn−1, Sn and Em; a data line $D_R$, $D_G$ or $D_B$; and a power supply line Vdd, each line extending in one of first and second orthogonal directions. Further, red, green, and blue pixel driving circuits are provided within the red, green, and blue pixels, respectively. Each pixel driving circuit includes five transistors M1 through M5, and two capacitors Cvth and Cst.

The red, green, and blue pixel driving circuits are connected to red, green, and blue pixel electrodes 15R, 15G and 15B, respectively. In more detail, one of the source and drain electrodes of a thin film transistor M4 included in the green pixel driving circuit is connected to the green pixel electrode 15G through a via hole 14. The via hole 14 is formed on the green pixel electrode 15G, and consequently, this area cannot be used to emit light. Because of the necessity of this Non Light emitting Area NLA, (refer to FIG. 1), the size of the subsequently formed aperture is reduced from optimal and thus the aperture ratio is limited.

Furthermore, in the conventional top-emitting organic light emitting device, each pixel electrode 15R, 15G, and 15B is formed to have a minimum size depending on a design rule. Also, each pixel electrode 15R, 15G, and 15B is designed not to overlap each data line $D_R$, $D_G$, and $D_B$, thereby minimizing crosstalk due to parasitic capacitance. For example, in the case of a 2.2 inch quarter video graphic array (QVGA) having 240×320 pixels, each pixel has a width of 47 μm, and a space $T_A$ between neighboring pixel electrodes is 17 μm, so that each pixel electrode can be designed to a width of 30 μm (47 μm−17 μm). As described above, in the conventional top-emitting organic light emitting device, each pixel electrode is designed to a minimum width, and neighboring pixel electrodes are designed to be widely spaced apart from each other by as much as 17 μm. Therefore, the wide space $T_A$ between the pixel electrodes leaks emitted light, thereby deteriorating the voltage-current characteristics of the thin film transistors (e.g., M3 and M5 in FIG. 1), i.e., increasing photo-leakage.

SUMMARY OF CERTAIN INVENTIVE ASPECTS

The present invention provides a top-emitting organic light emitting device designed to maximize aperture ratio. Furthermore, the present invention provides a top-emitting organic light emitting device in which pixel electrodes are arranged to overlap all thin film transistors below so as to reduce photo-leakage between the pixel electrodes.

In an example embodiment, a top-emitting organic light emitting device includes: a plurality of pixels formed at intersection regions where a plurality of data lines, a plurality of scan lines, a plurality of emission control lines, and a plurality of power supply lines are arranged on a substrate in column and row directions; a pixel driving circuit having a plurality of thin film transistors for driving the plurality of pixels, respectively; and a pixel electrode overlapping all the thin film transistors.

In another exemplary embodiment according to the present invention, a top-emitting organic light emitting device includes: a substrate; a plurality of thin film transistors formed on the substrate, each thin film transistor including a semiconductor layer, a gate electrode, and source and drain electrodes; a data line and a power supply line formed in the same layer as the source and drain electrodes; a passivation layer formed on the plurality of thin film transistors; a planarization layer formed on the passivation layer; a via hole formed in the passivation layer and the planarization layer and exposing one of the source and drain electrodes; a pixel electrode formed on the planarization layer and connected to one of the source and drain electrodes through the via hole; and an organic layer including an organic emitting layer formed on the pixel electrode, and a counter electrode, wherein the pixel electrode is formed to overlap all the thin film transistors.

BRIEF DESCRIPTION OF THE DRAWINGS

The above and other features and advantages of certain embodiments will become more apparent through the following detailed description of certain embodiments with reference to the attached drawings.

DETAILED DESCRIPTION OF CERTAIN INVENTIVE EMBODIMENTS

The present invention will now be described more fully with reference to the accompanying drawings, in which embodiments of the invention are shown. This invention may, however, be embodied in different forms and should not be construed as limited to the example embodiments set forth herein. Rather, these embodiments are provided so that this disclosure will be thorough and complete, and will convey the various aspects of the invention to those skilled in the art. In the accompanying drawings, when a layer is illustrated as being formed on another layer or a substrate, the layer may be formed directly on the other layer or substrate or a third layer may be interposed therebetween.

Figure 2:
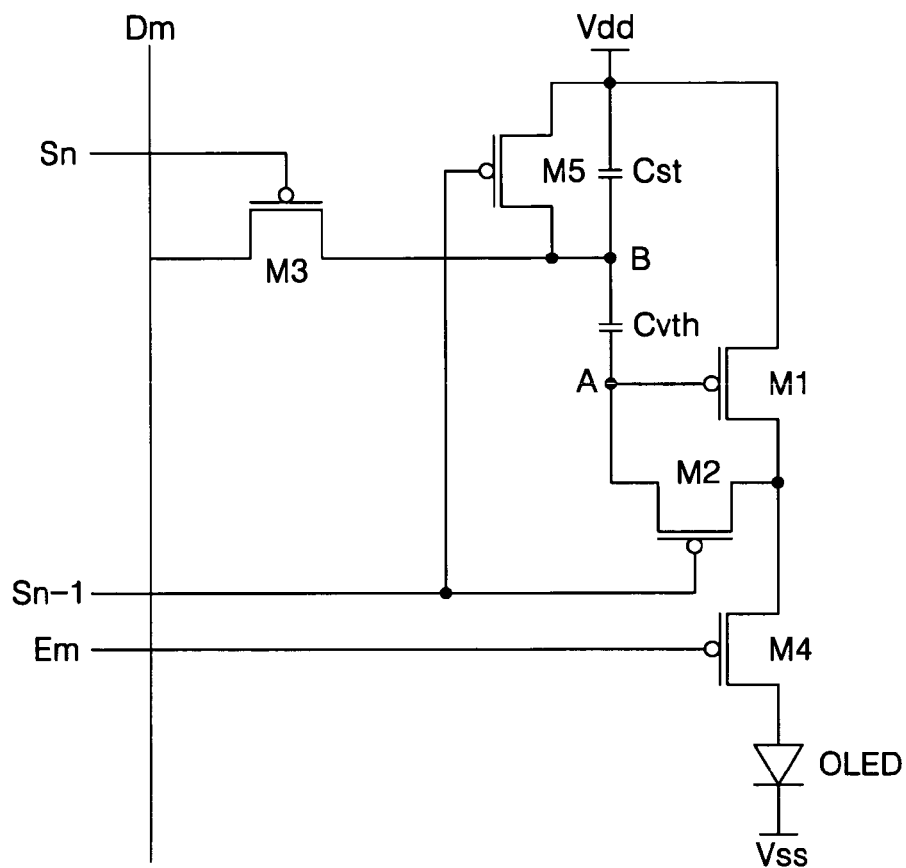
FIG. 2 is a circuit diagram illustrating a pixel circuit of an organic light emitting device according to one exemplary embodiment.

FIG. 2 is a circuit diagram of an organic light emitting device according to an embodiment.

For convenience, a pixel circuit connected to the m$^{th}$ data line Dm and the n$^{th}$ scan line Sn is illustrated in FIG. 2. A scan line for transmitting the current selection signal will be referred to as a "present scan line Sn", and a scan line for transmitting a selection signal immediately prior to the current selection signal will be referred to as a "previous scan line Sn−1".

Referring to FIG. 2, a pixel circuit includes an organic light emitting diode OLED and a pixel driving circuit for driving the organic light emitting diode OLED. The pixel driving circuit includes first through fifth thin film transistors M1 through M5 and two capacitors Cst and Cvth.

The first thin film transistor M1 is used as a driving transistor for driving the organic light emitting diode OLED and is connected between a power supply Vdd and the organic light emitting diode OLED. When a data voltage is applied to the gate of the first thin film transistor M1, the first thin film transistor M1 causes a current to flow in the organic light emitting diode OLED through the fourth thin film transistor M4. The second thin film transistor M2 causes the first thin film transistor M1 to be diode connected in response to a selection signal transmitted by the previous scan line Sn−1.

The gate of the first thin film transistor M1 is connected to a first electrode A of the capacitor Cvth. Further, the capacitor Cst and the fifth thin film transistor M5 are connected in parallel between a second electrode B of the capacitor Cvth and the power supply Vdd. The fifth thin film transistor M5 supplies a power supply voltage Vdd to the second electrode B of the capacitor Cvth in response to the selection signal transmitted by the previous scan line Sn−1.

The third thin film transistor M3 supplies a data voltage from the data line Dm to the second electrode B of the capacitor Cvth in response to the selection signal transmitted by the present scan line Sn. The fourth thin film transistor M4 is connected between the drain of the first thin film transistor M1 and the pixel electrode of the organic light emitting diode OLED and causes the drain of the first thin film transistor M1 to be selectably electrically connected to the organic light emitting diode OLED according to an emission control signal transmitted by an emission control line Em.

The organic light emitting diode OLED includes a pixel electrode, an organic emitting layer, and a counter electrode facing the pixel electrode, and emits light corresponding to a driving current supplied from the first thin film transistor M1. A reference voltage Vss applied to the counter electrode of the organic light emitting diode OLED has a lower voltage level than the power supply voltage Vdd. A ground voltage or the like can be used as the reference voltage Vss. Below, operation of the pixel circuit will be described with reference to FIG. 3.

Figure 3:
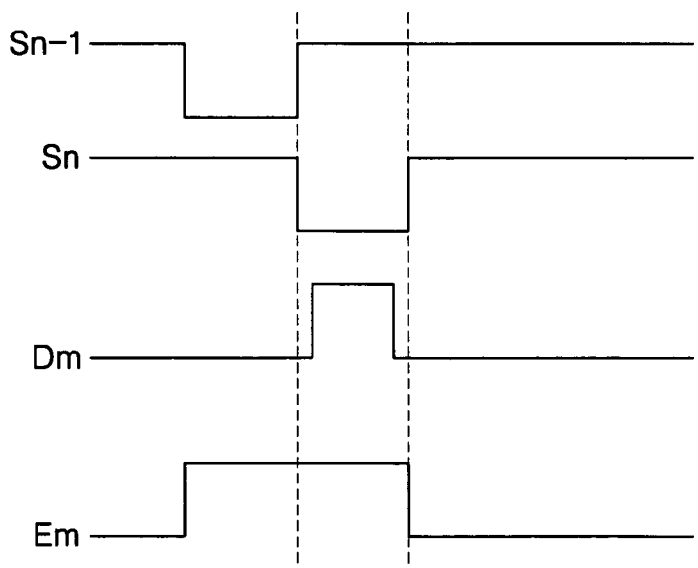
FIG. 3 is a timing diagram of the input signals of the pixel circuit shown in FIG. 2.

FIG. 3 is a timing diagram of the pixel circuit shown in FIG. 2.

Referring to FIG. 3, first, when a low-level selection signal is applied to the previous scan line Sn−1, the second thin film transistor M2 turns on, thereby causing the first thin film transistor M1 to be diode connected. Thus, the voltage between the gate and the source of the first thin film transistor M1 becomes the threshold voltage Vth of the first thin film transistor M1. Also, the source of the first thin film transistor M1 is connected to the power supply Vdd so that a voltage applied to the gate of the first thin film transistor M1, i.e., to the node A of the capacitor Cvth, is equal to a difference between the power supply voltage Vdd and the threshold voltage Vth. Further, the fifth thin film transistor M5 is turned on, and the power supply voltage Vdd is applied to the node B of the capacitor Cvth. Therefore, a voltage $V_{Cvth}$ charged in the capacitor Cvth is as follows.

$$V_{Cvth} = V_B - V_A = Vdd - (Vdd - Vth) = Vth \qquad \text{[Equation 1]}$$

where, $V_{Cvth}$ is the voltage charged in the capacitor Cvth, $V_A$ is a voltage applied to the node A of the capacitor Cvth, and $V_B$ is a voltage applied to the node B of the capacitor Cvth. Furthermore, the fourth thin film transistor M4 is turned off in response to a high-level signal of the emission control line Em, and interrupts the current flowing from the first thin film transistor M1 to the organic light emitting diode OLED.

Then, when a low-level selection signal is applied to the present scan line Sn, the third thin film transistor M3 turns on, and applies the data voltage Vdata to the node B. Further, because the capacitor Cvth is charged with a voltage corresponding to the threshold voltage Vth of the first thin film transistor M1, a voltage corresponding to the difference between the data voltage Vdata and the threshold voltage Vth of the first thin film transistor M1 is applied to the gate of the first thin film transistor M1.

Lastly, the fourth thin film transistor M4 is turned on in response to a low-level signal of the emission control line Em so that a current $I_{OLED}$ corresponding to the voltage $V_{GS}$ applied between the gate and the source of the first thin film transistor M1 is supplied to the organic light emitting diode OLED, thereby causing the organic light emitting diode to emit light.

Here, the current $I_{OLED}$ flowing through the organic light emitting diode OLED is as follows:

$$I_{OLED}=k(Vgs-Vth)^2=k\{(Vdd-V\text{data}+Vth)-Vth\}^2=K(Vdd-V\text{data})^2 \quad \text{[Equation 2]}$$

where, $I_{OLED}$ is the current flowing through the organic light emitting diode OLED, Vgs is the voltage applied between the source and the gate of the first thin film transistor M1, Vth is the threshold voltage of the thin film transistor M1, Vdata is the data voltage, and k is a constant related to the size of the thin film transistor M1 and to the electrical properties of the thin film transistor M1 characteristic of the process used to fabricate the thin film transistors.

As described above, the current $I_{OLED}$ flowing through the organic light emitting diode OLED depends on the power supply voltage Vdd and the data voltage Vdata, but does not depend on the threshold voltage of any of the transistors. Accordingly, brightness does not depend on the transistor threshold voltage, and the problem of non-uniform brightness due to different threshold voltages of different driving transistors is solved.

Figure 4:
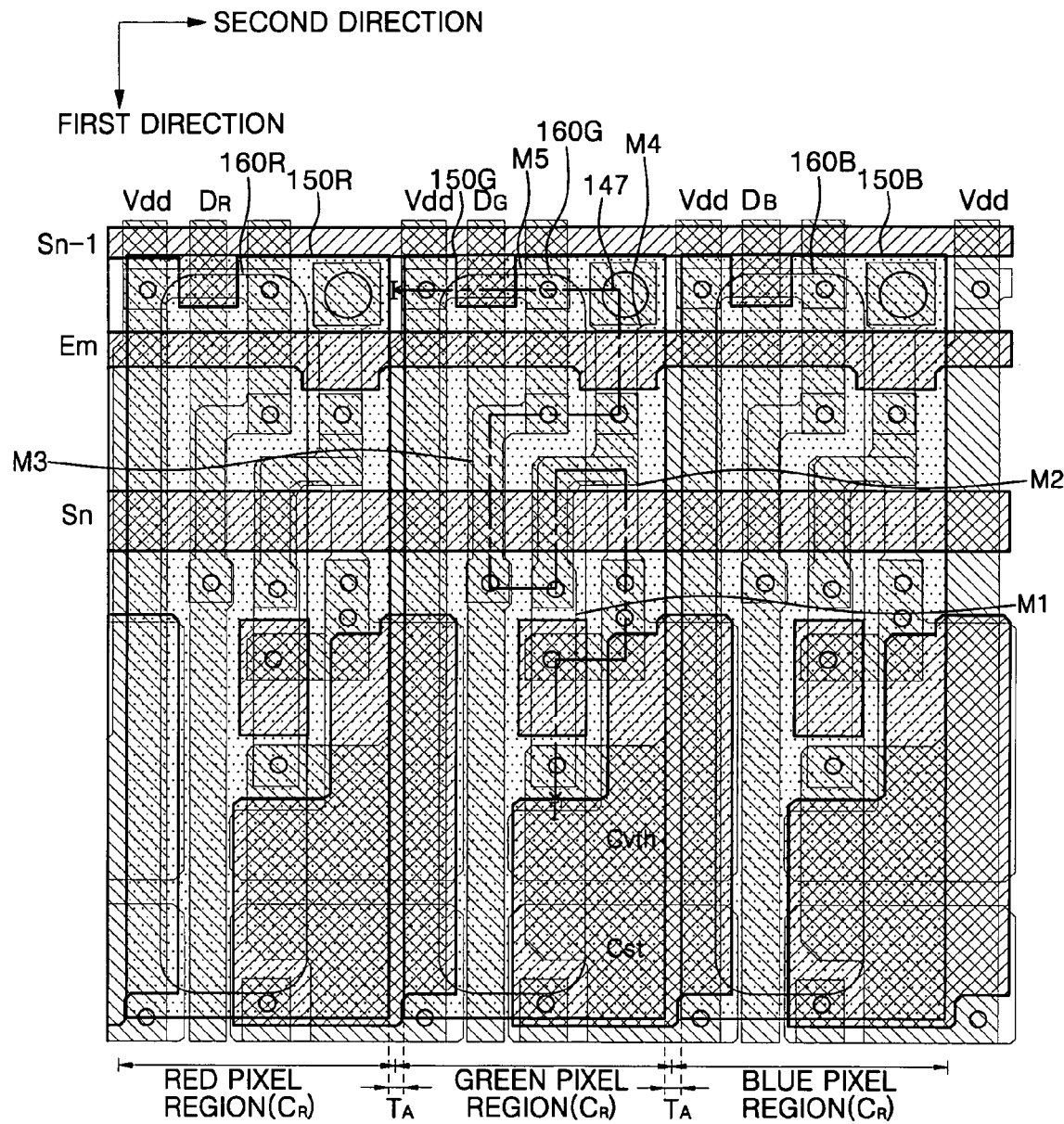
FIG. 4 is a layout of red, green, and blue pixels of a pixel array in a top-emitting organic light emitting device according to an example embodiment.

FIG. 4 is a layout of red, green, and blue pixels of a pixel array in a top-emitting organic light emitting device according to an exemplary embodiment of the present invention.

Referring to FIG. 4, signal lines are arranged on a substrate. The signal lines include scan lines Sn−1, Sn and Em; data lines $D_R$, $D_G$ and $D_B$; and a plurality of power supply lines Vdd. The data lines $D_R$, $D_G$ and $D_B$ are parallel to one another and extend in a first direction, which is vertical in the embodiment of FIG. 4. The scan lines Sn−1, Sn and Em are parallel to one another, and extend in a second direction. Which is horizontal in the embodiment of FIG. 4. The data lines $D_R$, $D_G$ and $D_B$ are insulated from and intersect the scan lines Sn−1, Sn and Em. Likewise, the power supply lines Vdd are insulated from and intersect the scan lines Sn−1, Sn and Em, and extend parallel to the data lines $D_R$, $D_G$ and $D_B$ in the first direction. The plurality of data lines $D_R$, $D_G$ and $D_B$ include a red data line $D_R$, a green data line $D_G$, and a blue data line $D_B$. As discussed above, the relationship between the previous scan line Sn−1 and the present scan line Sn of an adjacent previous pixel (not shown) is such that they are connected and, therefore, receive the same selection signal.

Among the aforementioned signal lines, the scan lines Sn−1, Sn and Em and the data lines $D_R$, $D_G$ and $D_B$ intersect each other within red, green, and blue pixel regions $C_R$, $C_G$ and $C_B$. In this specification, a pixel region means a region near a pixel driving circuit, which controls the driving current applied to an organic light emitting diode OLED. In the case of the pixel circuit shown in FIG. 2, the pixel region indicates a region of the substrate on which devices other than the organic light emitting diode OLED are formed.

The red, green, and blue pixel driving circuits are disposed on the red, green, and blue pixel regions $C_R$, $C_G$ and $C_B$, respectively. Each pixel driving circuit includes first through fifth transistors M1 through M5, and two capacitors Cvth and Cst. Because the pixel driving circuit has the same connection structure and the same driving method as shown in FIGS. 2 and 3, the descriptions thereof will not be repeated.

The red, green, and blue pixel driving circuits are connected to red, green, and blue pixel electrodes 150R, 150G, and 150B, respectively. In more detail, one of the source and drain electrodes of the fourth thin film transistor M4 included in each pixel driving circuit is connected to each pixel electrode 150R, 150G, and 150B through a via hole 147. Each via hole 147 is placed in an outer portion of each pixel electrode 150R, 150G, and 150B. For example, each via hole 147 is positioned in an upper right portion of each pixel electrode 150R, 150G, and 150B, so that the emission region opening has the maximum aperture ratio. Thus, the Non Light emitting Area NLA of the organic light emitting device can be reduced so that the emission region expands, thereby maximizing the aperture ratio.

The opening is the emission region within each pixel electrode 150R, 150G, and 150B, where an organic emitting layer and a counter electrode are sequentially formed. The pixel electrodes 150R, 150G, and 150B, the organic emitting layer, and the counter electrode form the organic light emitting diode OLED.

Figure 1:
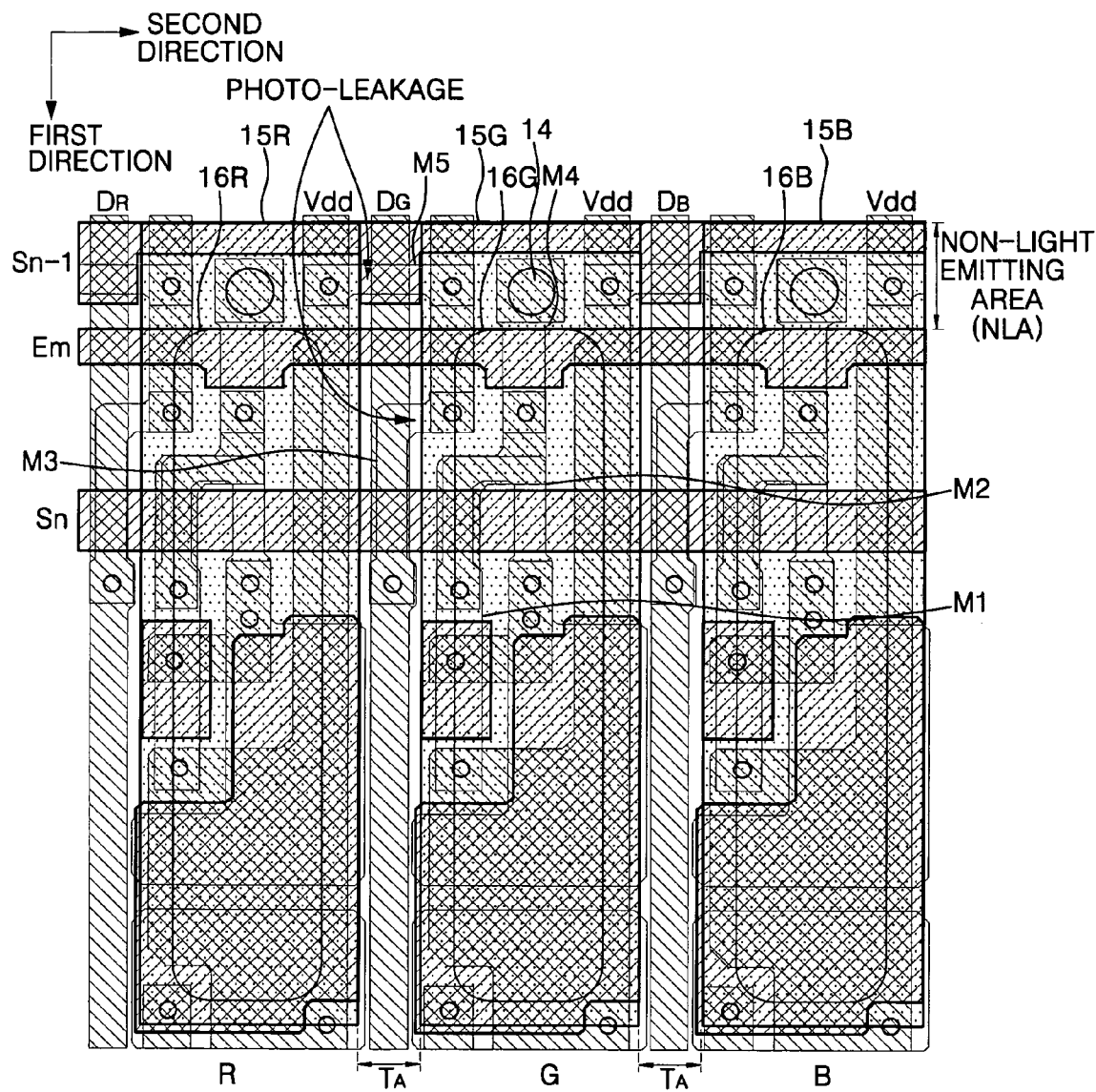
FIG. 1 is a layout of red, green, and blue pixels of a pixel array in a conventional top-emitting organic light emitting device.

The pixel electrodes 150R, 150G, and 150B are arranged on the pixel regions $C_R$, $C_G$ and $C_B$, leaving an insulating layer therebetween. The pixel electrodes 150R, 150G, and 150B are arranged to overlap the first through fifth thin film transistors M1 through M5 included in each pixel driving circuit. Thus, the problem of photo-leakage of the thin film transistor in the conventional organic light emitting device shown in FIG. 1 due to light escaping through an empty space between each of the pixel electrodes 150R, 150G, and 150B, can be reduced.

Further, the pixel electrodes 150R, 150G, and 150B are designed to have the maximum size on the basis of an allowable layout design rule, and minimize spaces between the pixel electrodes 150R, 150G, and 150B. For example, in the case of a 2.2 inch QVGA having 240×320 pixels, each pixel has a width of 47 μm, and a space between the neighboring pixel electrodes is 4 μm, so that each pixel electrode can be designed to a width of 43 μm (47 μm−4 μm). That is, the pixel electrode according to an example embodiment of the present invention can be designed to have a 13 μm larger width than the conventional pixel electrode having a width of 30 μm. Thus, the pixel electrodes 150R, 150G, and 150B are designed to have the maximum width, so that each pixel electrode 150R, 150G, and 150B can overlap the data lines $D_R$, $D_G$, and $D_B$ as well as all thin film transistors M1 through M5, leaving an insulating material between each of the pixel electrodes 150R, 150G, and 150B. Crosstalk may arise due to parasitic capacitance between each pixel electrode 150R, 150G and 150B and each data line $D_R$, $D_G$ and $D_B$. However, the parasitic capacitance can be reduced by forming a thick insulating layer (e.g., a planarization layer) under each pixel electrode 150R, 150G, and 150B. For example, a planarization layer having a thickness of 5000 Å through 30000 Å is formed on the data lines $D_R$, $D_G$, and $D_B$ to reduce parasitic capacitance, thereby reducing crosstalk due to capacitive coupling.

Figure 5:
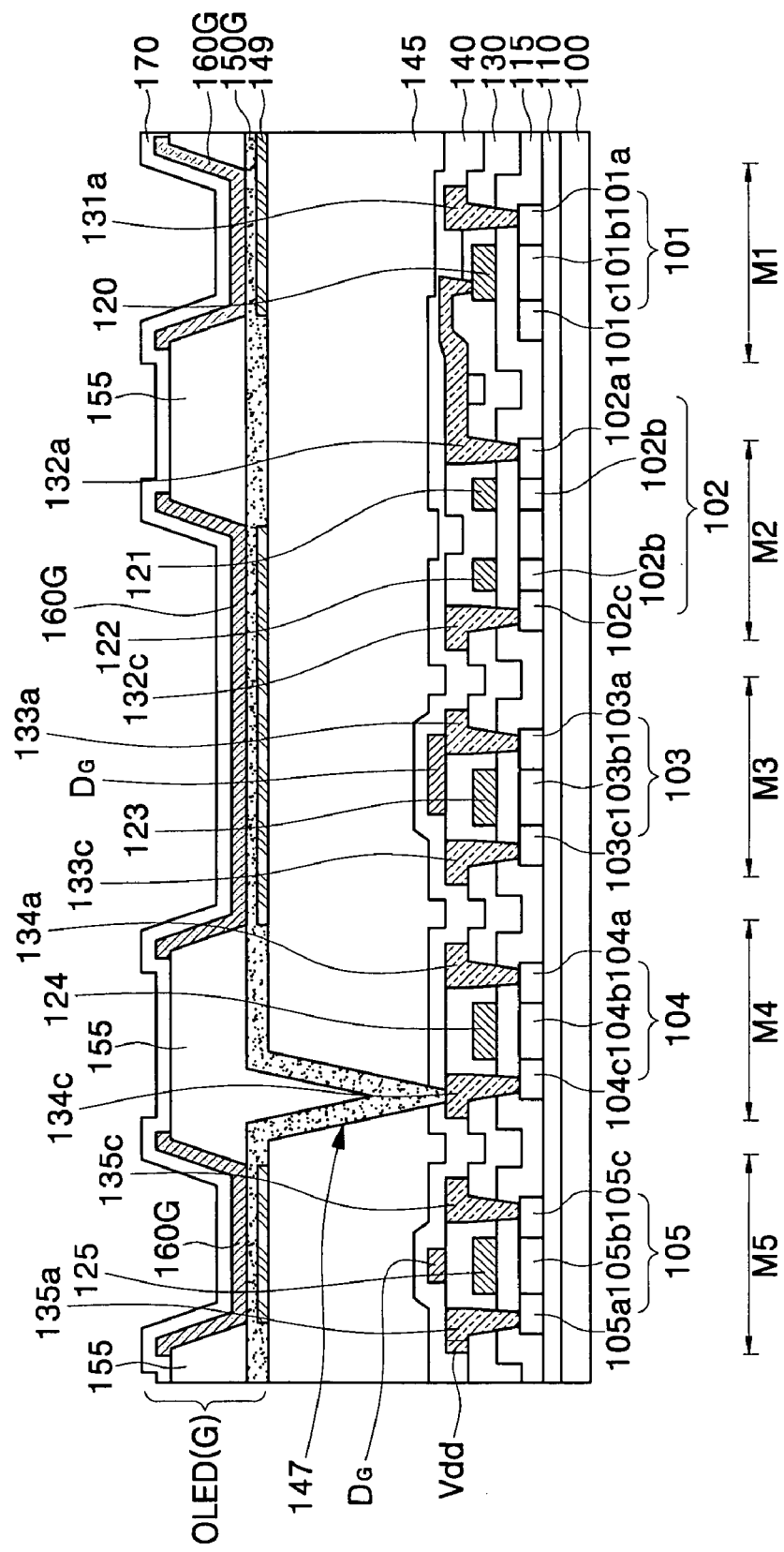
FIG. 5 is a cross-sectional view of a green pixel region in the top-emitting organic light emitting device of FIG. 4 taken along line I-I' in FIG. 4.

FIG. 5 is a cross-sectional view of the green pixel region in the top-emitting organic light emitting device according to the embodiment of FIG. 4, taken along line I-I' in FIG. 4. The red pixel region and the blue pixel region are formed by the same process as the green pixel region, so the description of these regions will not be repeated.

Referring to FIG. 5, a substrate 100 is provided on which the green pixel region $C_G$ is formed. The substrate 100 may be transparent or opaque. Here, the substrate 100 can be made of various materials, some of which include glass, plastic, quartz, silicon, and/or metal.

A buffer layer 110 may be formed on the substrate 100. Here, the buffer layer 110 can be formed of such materials as a silicon dioxide (SiO$_2$) layer, a silicon nitride (SiNx) layer, a silicon oxynitride (SiO$_2$Nx) layer, or a multi-layer thereof. The buffer layer may also comprise other materials.

First through fifth semiconductor layers 101 through 105 are formed on the buffer layer 110. The semiconductor layers 101 through 105 may be formed of various materials, such as amorphous silicon (a-si) or poly-silicon (poly-Si) obtained by crystallizing the amorphous silicon (a-si). The semiconductor layers 101 through 105 may be formed of poly-silicon having high charge mobility. A gate insulating layer 115 is formed on the semiconductor layers 101 through 105. The gate insulating layer 115 can be formed of materials such as, but not limited to, a silicon dioxide (SiO$_2$) layer, a silicon nitride (SiNx) layer, a silicon oxynitride (SiO$_2$Nx) layer, or a multi-layer thereof.

Gate electrodes 120 through 125 are formed on the gate insulating layer 115, over the first through fifth semiconductor layers 101 through 105, respectively. Among the gate electrodes 120 through 125, the gate electrodes 121 and 122 function as a dual gate of the second semiconductor layer 102. Scan lines (refer to Sn, Sn–1 and Em of FIG. 2) can be formed while the gate electrodes 120 through 125 are formed. For example, the gate electrodes 121 through 123 are formed while the scan line Sn is formed, the gate electrode 124 is formed while the scan line Em is formed, and the gate electrode 125 is formed while the scan line Sn–1 is formed.

Then, the first through fifth semiconductor layers 101 through 105 are doped with conductive impurities (n+ ions or p+ ions), using the gate electrodes 120 through 125 as masks. Therefore, source regions 101a through 105a and drain regions 101c through 105c are formed in the semiconductor layers 101 through 105, respectively. At this time, channel regions 101b through 105b are defined between the source regions 101a through 105a and the drain regions 101c through 105c.

An interlayer insulating layer 130 is formed on the gate electrodes 120 through 125. Contact holes respectively exposing the source and drain regions 101a through 105a/101c through 105c are formed in the interlayer insulating layer 130 and the gate insulating layer 115. A conductive layer is deposited on the substrate in which the contact holes are formed and then patterned to form source electrodes 132a through 135a, drain electrodes 132c through 135c, a data line D$_G$, and a power supply line Vdd. The source electrodes 132a through 135a and the drain electrodes 132c through 135c contact the exposed source and drain regions 101a through 105a and 102c through 105c, respectively. Here, the source electrode 132a is in contact with the gate electrode 120. Further, the power supply line Vdd is electrically connected to the source electrode 135a, and the data line D$_G$ is connected to the source electrode 133a.

The semiconductor layer 101, the gate electrode 120, the source electrode 131a, and the drain electrode (not shown) form the first thin film transistor M1 (refer to FIG. 2). Further, the semiconductor layer 102, the gate electrodes 121 and 122, the source electrode 132a, and the drain electrode 132c form the second thin film transistor M2 (refer to FIG. 2). Also, the semiconductor layer 103, the gate electrode 123, the source electrode 133a, and the drain electrode 133c form the third thin film transistor M3 (refer to FIG. 2). Likewise, the semiconductor layer 104, the gate electrode 124, the source electrode 134a, and the drain electrode 134c form the fourth thin film transistor M4 (refer to FIG. 2). Furthermore, the semiconductor layer 105, the gate electrode 125, the source electrode 135a, and the drain electrode 135c form the fifth thin film transistor M5 (refer to FIG. 2).

A passivation layer 140 is formed on the entire surface of the substrate having the source electrodes 132a through 135a and the drain electrodes 132c through 135c. The passivation layer 140 can be formed of materials such as a silicon dioxide (SiO$_2$) layer, a silicon nitride (SiNx) layer, or a multi-layer thereof. In some embodiments, the passivation layer 140 is formed of the silicon nitride (SiNx) layer that effectively blocks gas and moisture to protect the thin film transistor below, and contains abundant hydrogen to avoid incomplete bonding at the grain boundaries of the poly silicon layer.

An organic planarization layer 145 is formed on the passivation layer 140 and planarizes the texture of the passivation layer 140. The planarization layer 145 may be made of materials such as benzocyclobutene (BCB), polyimide, or polyacryl. The pixel electrode to be formed in the following process is formed on the planarization layer 145 and overlaps the data line D$_G$ such that crosstalk may arise due to the parasitic capacitance. To reduce the parasitic capacitance, the planarization layer 145 may be thick. In some embodiments, the planarization layer 145 has a thickness of 5000 Å or more to substantially prevent the crosstalk due to parasitic capacitance. In other embodiments, the planarization layer 145 has a thickness of no more than 30000 Å in consideration of an aspect ratio of the via hole 147.

The via hole 147 is formed in the passivation layer 140 and the plarnarization layer 145 to expose the drain electrode 134C of the fourth thin film transistor M4.

The pixel electrode 150G is formed on the planarization layer 145 having the via hole 147. The pixel electrode 150G is connected to the drain electrode 134c exposed through the via hole 147 and extends on the planarization layer 145. In more detail, the pixel electrode 150G is formed to overlap the first through fifth thin film transistors M1 through M5. Thus, photo-leakage of the thin film transistor is decreased between the pixel electrode 150G and the neighboring electrodes 150R and 150B. Further, the pixel electrode 150G can be over the data line D$_G$ and the power supply line Vdd. Therefore, the pixel electrode 150G according to an example embodiment of the present invention is wider than the pixel electrode 15G of the conventional top-emitting organic light emitting device shown in FIG. 1.

Additionally, because the organic light emitting device according to an exemplary embodiment of the present invention is a top-emitting device, the pixel electrode 150G may be formed of a reflective conductive layer. The reflective conductive layer may include silver (Ag), aluminum (Al), nickel (Ni), platinum (Pt), palladium (Pd), or an alloy thereof, which have a high work function. Further, the reflective conductive layer may include magnesium (Mg), calcium (Ca), barium (Ba), or an alloy thereof, which have a low work function. Other materials and alloys may also be used.

Alternatively, a reflective layer pattern 149 may be additionally formed under the pixel electrode 150G before forming the pixel electrode 150G, and then the pixel electrode 150G can be formed of a transparent conductive layer. The transparent conductive layer may be formed of, for example, indium tin oxide (ITO) or indium zinc oxide. In some embodiments, the reflective layer pattern 149 has a reflectivity of 60% or more. The reflective layer pattern 149 can include such materials as aluminum (Al), an aluminum alloy, silver (Ag), a silver alloy, or an alloy thereof. Such a reflective layer pattern 149 can be spaced apart from the via hole 149.

A pixel defining layer 155 having an opening which exposes at least a portion of each pixel electrode may be formed on the pixel electrode 150G. The pixel defining layer 155 can be formed of various materials. For example, benzocyclobutene (BCB), acrylic photoresist, phenolic photoresist, or imide photoresist may be used. Other materials may also be used.

A green organic emitting layer 160G is formed on the green pixel electrode 150G exposed through the openings. The organic emitting layer 160G can be formed, for example, by a vacuum deposition method, an inkjet printing method, or a laser induced thermal imaging method. Furthermore, a hole injecting layer, a hole transporting layer, a hole blocking layer, an electron transporting layer, or an electron injecting layer can be formed above or below the organic emitting layer 160G. Then, a counter electrode 170 is formed on the organic emitting layer 160G and the pixel defining layer 155. The counter electrode 170 may be formed on the entire surface of the substrate. Preferably, the counter electrode 170 is made of a transparent conductive layer. The transparent conductive layer may include materials such as, but not limited to ITO or IZO. For example, the transparent conductive layer may be formed of Mg, Ca, Al, Ag, Ba, and/or an alloy thereof, to a thickness thin enough to transmit light.

The pixel electrode 150, the green organic emitting layer 160G, and the counter electrode 170 form a green organic light emitting diode OLED (G). The green organic light emitting diode OLED (G) has an emission region defined by the openings in the pixel defining layer 155.

When the green light emitting diode OLED (G) is driven, holes from the pixel electrode and electrons from the counter electrode are injected into the green organic emitting layer 160G, or electrons from the pixel electrode and holes from the counter electrode are injected into the green organic emitting layer 160G. The injected holes and electrons combine within the green organic emitting layer 160G to form excitons. When the excitons transition from an excited state to a ground state, they emit light. The light emitted from the green organic emitting layer 160G is reflected from the pixel electrode 150G (when it is made of a reflective conductive layer) or from the reflective layer pattern 149 placed under the pixel electrode 150G (when it is made of a transparent conductive layer), and passes through the counter electrode 170 formed of the transparent conductive layer to be emitted to the outside,.

In the foregoing embodiments, the pixel driving circuit includes five thin film transistors and two capacitors, but the present invention is not limited to that configuration. Alternatively, the present invention can be applied to all pixel driving circuits operated by two or more thin film transistors and one or more capacitor.

Figure 6:
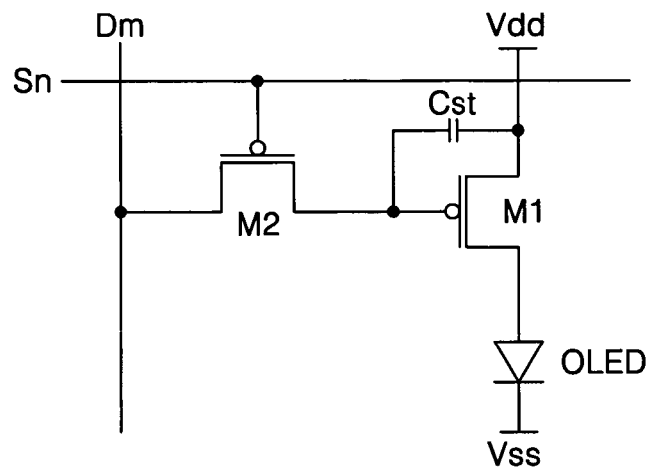
FIG. 6 is a circuit diagram illustrating a pixel circuit of an organic light emitting device according to another embodiment.

FIG. 6 is a circuit diagram illustrating a pixel circuit of an organic light emitting device according to another embodiment. FIG. 6 illustrates, as an example, a pixel circuit in an N by M array of pixel circuits. The pixel circuit of FIG. 6 is connected to the m$^{th}$ data line Dm and the n$^{th}$ scan line Sn.

Referring to FIG. 6, the pixel circuit includes an organic light emitting diode OLED and a pixel driving circuit for driving the organic light emitting diode OLED. The pixel driving circuit includes a first thin film transistor M1, a second thin film transistor M2, and a capacitor Cst. The first thin film transistor M1 is connected between a power supply Vdd and the organic light emitting diode OLED. The second thin film transistor M2 is turned on/off in response to a selection signal applied to the scan line Sn, and is connected between the data line Dm and a gate of the first thin film transistor M1. The capacitor Cst is connected between the power supply Vdd and the gate of the first thin film transistor M1.

The pixel circuit shown in FIG. 6 operates as follows. First, when the selection signal is applied to the scan line Sn, the second thin film transistor M2 is turned on. In this state, a data voltage is applied from the data line Dm to a first terminal of the capacitor Cst via the second thin film transistor M2, and the capacitor Cst is charged with a voltage corresponding to the difference between a power supply voltage Vdd and the data voltage. The first thin film transistor M1 functions as a static current source where the amount of current supplied depends on the voltage stored on the capacitor Cst. The first thin film transistor M1 supplies the static current to the organic light emitting diode OLED. The organic light emitting diode OLED includes a pixel electrode, a counter electrode, and an organic emitting layer interposed between the pixel electrode and the counter electrode.

Here, the current flowing through the organic light emitting diode OLED is as follows:

$$I_{OLED}=k(Vgs-Vth)^2=k(Vdd-Vdata+Vth)^2 \quad \text{[Equation 3]}$$

where, $I_{OLED}$ is the current flowing through the organic light emitting diode OLED, Vgs is the voltage applied between the source and the gate of the first thin film transistor M1, Vth is the threshold voltage of the first thin film transistor M1, Vdata is the data voltage, and k is a constant related to the size of the thin film transistor M1 and to the electrical properties of the thin film transistor M1 characteristic of the process used to fabricate the thin film transistors.

The pixel driving circuit of FIG. 6 may further include a third thin film transistor (not shown) which is connected between the first thin film transistor M1 and the organic light emitting diode OLED and causes the driving current to be interrupted in response to an emission control signal of an emission control line (not shown) connected to the gate of the third thin film transistor M3.

The organic light emitting device of FIG. 6 may have the same pixel layout as that of FIG. 4 except that only the first and second thin film transistors M1 and M2 (and the third thin film transistors M3) are formed on the pixel regions (e.g., $C_R$, $C_G$, and $C_B$ of FIG. 4). Also, the pixel electrode may be formed to overlap the first and second thin film transistors M1 and M2 (and the third thin film transistors M3 if included).

Figure 7:
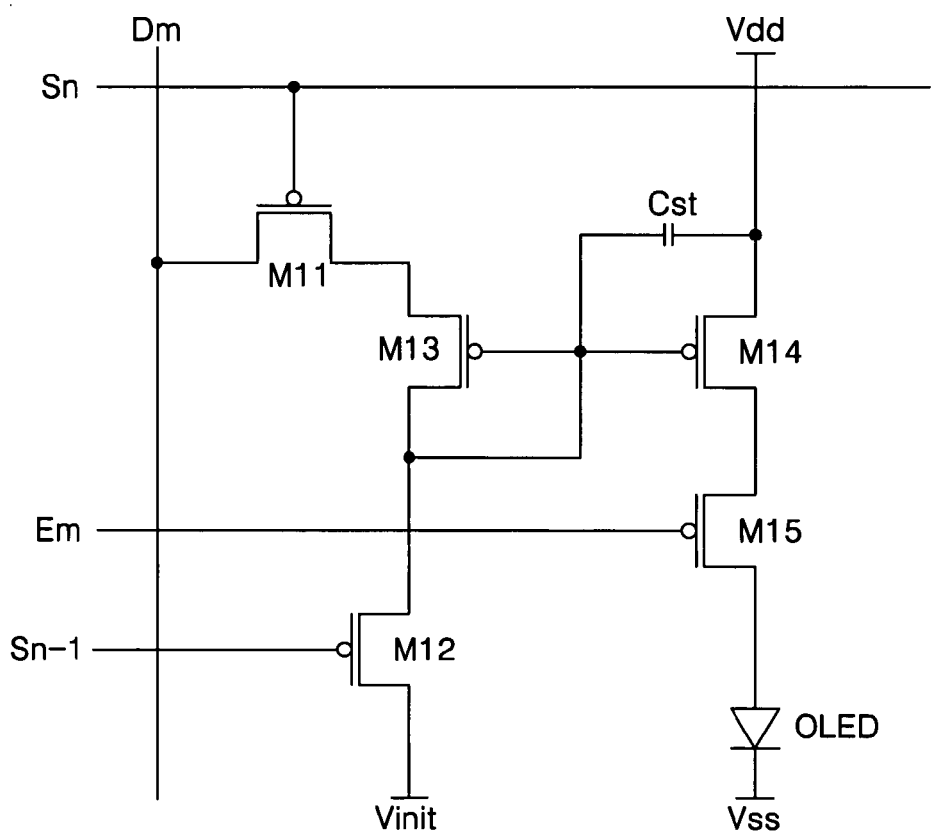
FIG. 7 is a circuit diagram illustrating a pixel circuit of an organic light emitting device according to still another embodiment.

FIG. 7 is a circuit diagram illustrating a pixel circuit of an organic light emitting device according to still another exemplary embodiment. Referring to FIG. 7, the pixel circuit includes an organic light emitting diode OLED and a pixel driving circuit for driving the organic light emitting diode OLED.

The pixel driving circuit of FIG. 7 includes first through fifth thin film transistors M11 through M15, and a capacitor Cst. In more detail, the first thin film transistor M11 has a gate to receive a present selection signal from a present scan line Sn, and a source to receive a data signal from a corresponding data line Dm. The second thin film transistor M12 has a gate to receive a previous selection signal from a previous scan line Sn−1 just previous to the present scan line, and a drain to receive an initialization voltage Vinit. The third and fourth thin film transistors M13 and M14 are connected in a mirror-image form and their gates are connected in common. The fifth thin film transistor M15 has a gate connected to an emission control line Em, and a drain connected to the drain of the fourth thin film transistor M14. The organic light emitting diode OLED is connected between the fifth thin film transistor M15 and a reference voltage Vss, and the capacitor Cst is connected between the gate and a source of the fourth thin film transistor M14. The organic light emitting diode OLED includes a pixel electrode, a counter electrode, and an organic emitting layer interposed between the pixel electrode and the counter electrode.

The above-described pixel circuit of the organic light emitting device operates as follows. First, during an initializing period, a low-level selection signal is applied to the previous scan line Sn−1, a high-level selection signal is applied to the present scan line Sn, and a high-level emission control signal is applied to the emission control line Em. Accordingly, the second thin film transistor M12 is turned on and the first and fifth thin film transistors M11 and M15 are turned off, thereby turning off the third and fourth thin film transistors M13 and M14 connected in the mirror-image form. Thus, data stored in the capacitor Cst is initialized into an initialization voltage Vinit through the second thin film transistor M12.

During a data programming period, a high-level selection signal is applied to the previous scan line Sn−1, a low-level selection signal is applied to the present scan line Sn, and a high-level emission control signal is applied to the emission control line Em. Accordingly, the second and fifth thin film transistors M12 and M15 are turned off and the first thin film transistor M11 is turned on, thereby turning on the third and fourth thin film transistors M13 and M14 connected in the mirror-image form. Thus, a data signal Vdata having a voltage level applied to the data line Dm is transmitted to the gate of the fourth thin film transistor M14 through the third thin film transistor M13.

Then, during an emission period, a high-level selection signal is applied to the previous scan line Sn−1, a high-level selection signal is applied to the present scan line Sn, and a low-level emission control signal is applied to the emission control line Em. Accordingly, the fifth thin film transistor M15 is turned on by the emission control signal and thus the driving current corresponding to a data signal Vdata having a voltage level applied to the gate of the fourth thin film transistor M14 flows in the organic light emitting diode OLED, thereby causing the organic light emitting diode OLED to emit light.

Here, the voltage applied to the gate of the fourth thin film transistor M14 is equal to "Vdata−Vth$_{M13}$", and the current flowing through the organic light emitting diode OLED is expressed by the following Equation 4:

$$I_{OLED} = k(Vgs_{M14} - Vth_{M14})^2 = k(Vdd - Vdata + Vth_{M13} - Vth_{M14})^2 = k(Vdd - Vdata)^2 \quad \text{[Equation 4]}$$

where, $I_{OLED}$ is the current flowing through the organic light emitting diode OLED, $Vgs_{M14}$ is the voltage applied between the source and the gate of the fourth thin film transistor M14, $Vth_{M13}$ is the threshold voltage of the third thin film transistor M13 and is equal to $Vth_{M14}$, the threshold voltage of the fourth thin film transistor M14, Vdata is the data voltage, and k is a constant related to the size of the thin film transistor M11 and to the electrical properties of the thin film transistor M1 characteristic of the process used to fabricate the thin film transistors.

Here, when the third and fourth transistors M13 and M14 forming a current mirror have the same threshold voltage, i.e., when $Vth_{M13} = Vth_{M14}$, the threshold voltage of the transistor can be compensated, thereby maintaining the uniformity of the driving current for the organic light emitting diode OLED independent of transistor threshold voltage.

The organic light emitting device of FIG. 7 has the same pixel layout as that of FIG. 4 except that an initialization voltage line Vinit is additionally provided in a column or row direction, and the first through fifth thin film transistors M11 and M15 and the capacitor Cst are formed on the pixel regions (e.g., $C_R$, $C_G$, and $C_B$ of FIG. 4).

In the pixel circuit shown in FIG. 7, tThe pixel electrode is formed on the insulating layer so as to overlap the first through fifth transistors M11 through M15. Further, the pixel electrode may also overlap the initialization voltage line Vinit.

Figure 8:
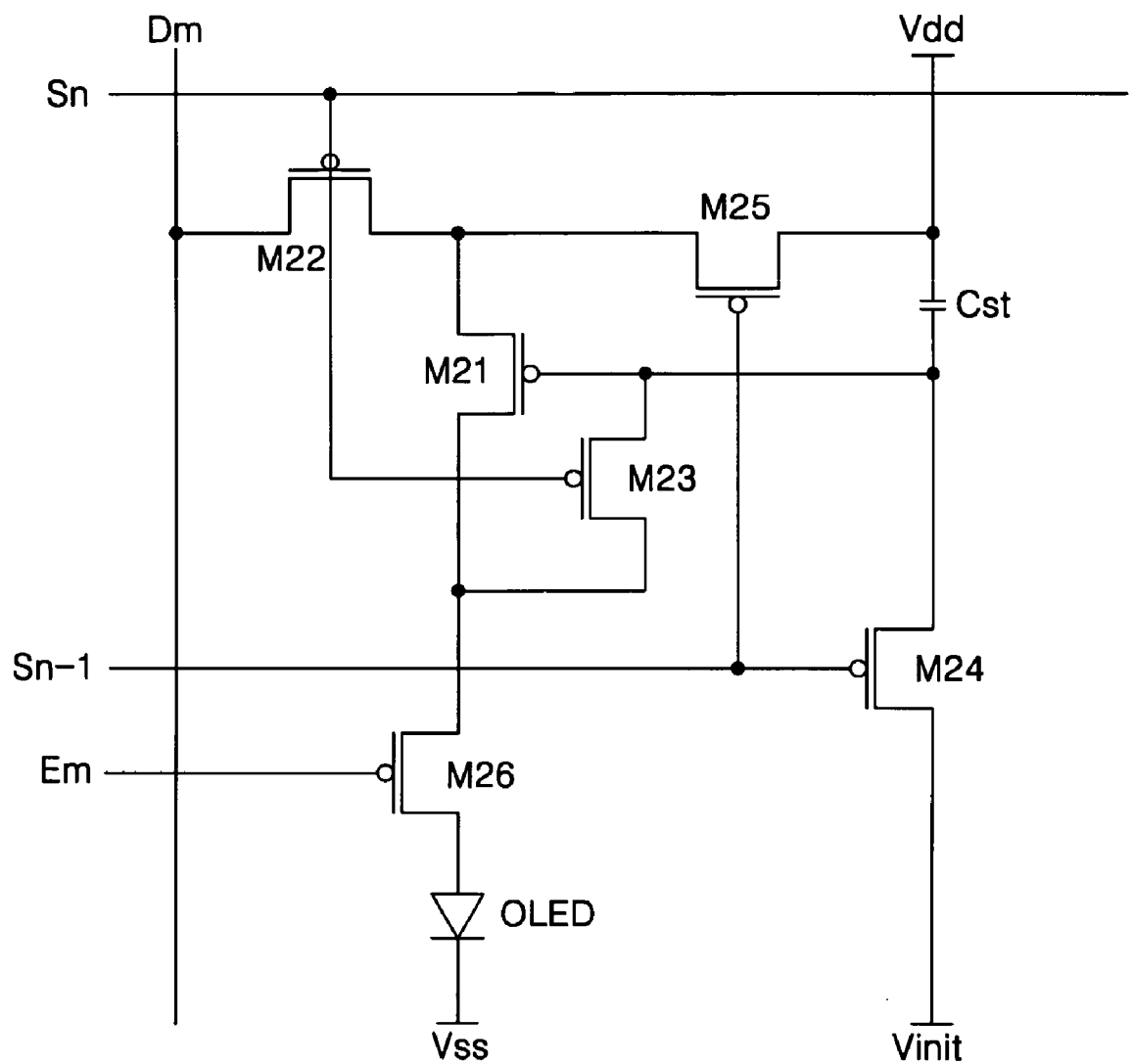
FIG. 8 is a circuit diagram illustrating a pixel circuit of an organic light emitting device according to yet another embodiment.

FIG. 8 is a circuit diagram illustrating a pixel circuit of an organic light emitting device according to yet another embodiment. Referring to FIG. 8, the pixel circuit comprises an organic light emitting diode OLED and a pixel driving circuit for driving the organic light emitting diode OLED. The pixel driving circuit includes first through sixth transistors M21 through M26 and one capacitor Cst. The second transistor M22 has a gate receiving a present selection signal from a corresponding scan line Sn, a source connected to a data line Dm and receiving a data signal, and a drain connected to a source of the first transistor M21.

The first transistor M21 has a gate connected to a first terminal of the capacitor Cst, and a drain connected to a first terminal of the organic light emitting diode OLED. The third transistor M23 has a drain connected to the gate of the first transistor M21, a source connected to the drain of the first transistor M21, and a gate receiving the present selection signal. The capacitor Cst has a second terminal to which a power supply voltage is supplied from a corresponding power supply line Vdd. The fifth transistor M25 has a gate receiving a previous selection signal, a source receiving the power supply voltage from the power supply line Vdd, and a drain connected to the drain of the second transistor M22.

The sixth transistor M26 has a gate receiving the emission control signal, a source connected to the drain of the first transistor M21, and a drain connected to the first terminal of the organic light emitting diode OLED. The fourth transistor M24 has a gate receiving the previous selection signal, a source connected to the first terminal of the capacitor Cst, and a drain connected to the initialization voltage line Vinit and receiving the initialization voltage. The organic light emitting diode OLED includes a pixel electrode, a counter electrode and an organic emitting layer interposed between the pixel electrode and the counter electrode.

The above-described pixel circuit of FIG. 8 operates as follows. First, during an initializing period, a low-level selection signal is applied to the previous scan line Sn−1, a high-level selection signal is applied to the present scan line Sn, and a high-level emission control signal is applied to the emission control line Em. Accordingly, the fourth transistor M24 and the fifth transistor M25 are turned on by the low-level selection signal applied to the previous scan line Sn−1, and the second, third and sixth transistors M22, M23, and M26 are turned off by the high-level selection signal applied to the present scan line Sn and the high-level emission control signal applied to the emission control line Em. Therefore, data stored in the capacitor Cst, i.e., a voltage applied to the gate of the first transistor M21, is initialized.

During a data programming period, a high-level selection signal is applied to the previous scan line Sn−1, a low-level selection signal is applied to the present scan line Sn, and a high-level emission control signal is applied to the emission control line Em. Accordingly, the fourth transistor M24 is turned off, and the third transistor M23 is turned on by the low-level selection signal applied to the present scan line Sn, thereby connecting the first transistor M21 like a diode. The second transistor M22 is turned on by the selection signal applied to the present scan line Sn, and the fifth and sixth transistors M25 and M26 are turned off. Thus, the first transistor M21 is connected like a diode so that the voltage applied to the gate of the first transistor M21 is equal to "Vdata−Vth$_{M21}$", and this gate voltage is stored in the capacitor Cst, thereby completing the data programming operation.

Last, during an emission period, a high-level selection signal is applied to the previous scan line Sn−1, a high-level selection signal is applied to the present scan line Sn, and a low-level emission control signal is applied to the emission control line Em. Accordingly, the sixth transistor M26 is turned on by the low-level emission control signal applied to the emission control line Em, the fourth and fifth transistors M24 and M25 are turned off by the high-level selection signal applied to the previous scan line Sn−1, and the third and second transistors M23 and M22 are turned off by the high-level selection signal applied to the present scan line Sn. Therefore, the driving current generated corresponding to the voltage level of the data signal applied to the gate of the first transistor M21 flows in the organic light emitting diode OLED through the first transistor M21, thereby causing the organic light emitting diode OLED to emit light.

At this time, the current flowing through the organic light emitting diode OLED is as follows:

$$I_{OLED} = k(Vgs_{M21} - Vth_{M21})^2 = k(Vdd - V\text{data} + Vth_{M21} - Vth_{M21})^2 = k(Vdd - V\text{data})^2 \quad \text{[Equation 5]}$$

where, $I_{OLED}$ is the current flowing through the organic light emitting diode OLED, $Vgs_{M21}$ is the voltage applied between the source and the gate of the first transistor M21, $Vth_{M21}$ is the threshold voltage of the first transistor M21, Vdata is the data voltage, Vdd is a power supply voltage, and k is a constant related to the size of the thin film transistor M21 and to the electrical properties of the thin film transistor M1 characteristic of the process used to fabricate the thin film transistors.

Referring to Equation 5, the driving current that flows through the organic light emitting diode OLED corresponds to the voltage level of the data signal applied to the data line, regardless of the threshold voltage of the first transistor M21.

The organic light emitting device of FIG. 8 has the same pixel layout as that of FIG. 4, except that an initialization voltage line Vinit is additionally provided in a column or row direction, and the first through sixth transistors M21 and M26 and the capacitor Cst are formed on the pixel regions (e.g., $C_R$, $C_G$, and $C_B$ of FIG. 4). The pixel electrode is formed so as to overlap the first through sixth transistors M21 through M26. Further, the pixel electrode may overlap the initialization voltage line Vinit.

As described above, various embodiments provide a top-emitting organic light emitting device in which the width of a pixel electrode is maximized, thereby enhancing aperture ratio. Furthermore, the pixel electrode is arranged to overlap all thin film transistors, so that light is prevented from leaking through a space between neighboring pixel electrodes, thereby reducing photo-leakage of the thin film transistor.

Although the present invention has been described with reference to certain example embodiments thereof, changes may be made to the described embodiments without departing from the scope of the present invention.

What is claimed is:

1. A top-emitting organic light emitting device comprising:
   an array of pixel circuits, the array comprising a plurality of data lines, a plurality of scan lines, a plurality of emission control lines, and a plurality of power supply lines arranged on a substrate, each pixel circuit of the array comprising:
      an organic light emitting diode (OLED), including a pixel electrode; and
      a pixel driving circuit configured to drive the OLED, the pixel driving circuit comprising a plurality of thin film transistors, wherein the pixel electrode overlaps substantially all of each of the thin film transistors.

2. The top-emitting organic light emitting device according to claim 1, wherein the pixel electrode is connected to one of the thin film transistors through a via hole.

3. The top-emitting organic light emitting device according to claim 2, wherein the via hole is formed at a corner of the pixel electrode.

4. The top-emitting organic light emitting device according to claim 1, wherein the pixel electrode and the data line overlap with an insulating layer interposed therebetween.

5. The top-emitting organic light emitting device according to claim 4, wherein the insulating layer has a thickness of 5000 Å through 30000Å.

6. The top-emitting organic light emitting device according to claim 1, wherein the pixel electrode is formed of a reflective conductive layer.

7. The top-emitting organic light emitting device according to claim 6, wherein the reflective conductive layer comprises at least one of silver (Ag), aluminum (Al), nickel (Ni), platinum (Pt), palladium (Pd), magnesium (Mg), calcium (Ca), barium (Ba).

8. The top-emitting organic light emitting device according to claim 1, wherein the pixel electrode comprises a transparent conductive layer and a reflective layer placed under the transparent conductive layer.

9. The top-emitting organic light emitting device according to claim 8, wherein the transparent conductive layer comprises at least one of indium tin oxide (ITO) and indium zinc oxide (IZO).

10. The top-emitting organic light emitting device according to claim 8, wherein the reflective layer comprises at least one of aluminum (Al), an aluminum alloy, silver (Ag), and a silver alloy.

11. The top-emitting organic light emitting device according to claim 1, wherein the pixel electrode is spaced apart from a neighbor pixel electrode at a distance between about 4 μm and about 17 μm.

12. The top-emitting organic light emitting device according to claim 1, wherein the pixel driving circuit comprises:
   a first thin film transistor configured to transmit a data signal in response to a selection signal transmitted through a scan line;
   a capacitor configured to store a voltage based on the data signal; and
   a second thin film transistor configured to transmit a driving current to the pixel electrode in response to the voltage stored on the capacitor.

13. The top-emitting organic light emitting device according to claim 12, wherein the pixel driving circuit further comprises a third thin film transistor connected between the second thin film transistor and the pixel electrode configured to selectively transmit and interrupt the driving current.

14. The top-emitting organic light emitting device according to claim 1, wherein the pixel driving circuit comprises:
   a first thin film transistor configured to supply a driving current to the pixel electrode in response to a power supply voltage and to a data voltage applied to a gate of the first thin film transistor;
   a first capacitor configured to store a voltage corresponding to the difference between the power supply voltage and the data voltage;
   a second capacitor configured to store a voltage corresponding to a threshold voltage of the first thin film transistor;

a second thin film transistor configured to connect the first thin film transistor like a diode in response to a selection signal transmitted through a previous scan line;

a third thin film transistor configured to supply the power supply voltage to a first terminal of the first capacitor in response to the selection signal transmitted through the previous scan line; and a fourth thin film transistor configured to supply the data voltage to the first terminal of the first capacitor in response to a selection signal transmitted through a present scan line.

15. The top-emitting organic light emitting device according to claim 14, wherein the pixel driving circuit further comprises a fifth thin film transistor connected between the first thin film transistor and the pixel electrode and configured to selectively transmit and interrupt the driving current.

16. The top-emitting organic light emitting device according to claim 1, wherein the pixel driving circuit comprises:

a first thin film transistor configured to transmit a data signal in response to a selection signal of a present scan line;

a capacitor configured to store a voltage based on the data signal;

a second thin film transistor configured to generate a driving current corresponding to the voltage stored on the capacitor;

a third thin film transistor configured to connect the second thin film transistor like a diode; and a fourth thin film transistor configured to transmit an initialization voltage to the capacitor in response to a selection signal of a previous scan line.

17. The top-emitting organic light emitting device according to claim 16, wherein the pixel driving circuit further comprises a fifth thin film transistor connected between the second thin film transistor and the pixel electrode and configured to transmit the driving current to the pixel electrode.

18. The top-emitting organic light emitting device according to claim 1, wherein the pixel driving circuit comprises:

a first thin film transistor configured to transmit a data signal in response to a selection signal of a present scan line;

a second thin film transistor configured to generate a driving current corresponding to the data signal transmitted with the first thin film transistor;

a third thin film transistor configured to connect the second thin film transistor like a diode;

a capacitor configured to store a voltage based on the data signal transmitted to the second thin film transistor;

a fourth thin film transistor configured to transmit an initialization voltage to the capacitor in response to a selection signal of a previous scan line; and a fifth thin film transistor configured to transmit a power supply voltage to the second thin film transistor in response to an emission control signal.

19. The top-emitting organic light emitting device according to claim 18, wherein the pixel driving circuit further comprises a sixth thin film transistor connected between the second thin film transistor and the pixel electrode and configured to transmit the driving current to the pixel electrode.

20. A top-emitting organic light emitting device comprising:

a substrate;

a pixel driving circuit comprising a plurality of thin film transistors formed on the substrate, each thin film transistor comprising a semiconductor layer, a gate electrode, and source and drain electrodes;

a data line and a power supply line formed in the same layer as the source and drain electrodes;

a passivation layer formed on the plurality of thin film transistors;

a planarization layer formed on the passivation layer;

a via hole formed in the passivation layer and the planarization layer and exposing one of the source and drain electrodes; and an organic light emitting diode (OLED), comprising a pixel electrode formed on the planarization layer and connected to the pixel driving circuit through the via hole, wherein the pixel driving circuit is configured to drive the OLED, and wherein the pixel electrode is formed to overlap substantially all of each of the thin film transistors of the pixel driving circuit.

21. The top-emitting organic light emitting device according to claim 20, wherein the pixel electrode overlaps the data line.

22. The top-emitting organic light emitting device according to claim 21, wherein the passivation layer and the planarization layer formed between the pixel electrode and the data line have a thickness of between about 5000 Å and about 30000 Å.

23. The top-emitting organic light emitting device according to claim 20, wherein the pixel electrode comprises a reflective conductive layer.

24. The top-emitting organic light emitting device according to claim 23, wherein the reflective conductive layer comprises at least one of silver (Ag), aluminum (Al), nickel (Ni), platinum (Pt), palladium (Pd), an alloy thereof, magnesium (Mg), calcium (Ca), barium (Ba), and an alloy thereof.

25. The top-emitting organic light emitting device according to claim 20, wherein the pixel electrode comprises a transparent conductive layer and a reflective layer placed under the transparent conductive layer.

26. The top-emitting organic light emitting device according to claim 25, wherein the transparent conductive layer comprises at least one of indium tin oxide (ITO) and indium zinc oxide (IZO).

27. The top-emitting organic light emitting device according to claim 25, wherein the reflective layer comprises at least one of aluminum (Al), an aluminum alloy, silver (Ag), and a silver alloy.

* * * * *